Jan. 21, 1964 C. R. COOK, JR 3,119,028

ACTIVE ELEMENT CIRCUIT EMPLOYING SEMICONDUCTIVE SHEET AS SUBSTITUTE FOR THE BIAS AND LOAD RESISTORS

Filed Feb. 10, 1961 4 Sheets-Sheet 1

CHARLES R. COOK, JR.
INVENTOR.

BY D. Carl Richards

CHARLES R. COOK, JR.
INVENTOR.
BY D. Carl Richards

ACTIVE ELEMENT CIRCUIT EMPLOYING SEMICONDUCTIVE SHEET
AS SUBSTITUTE FOR THE BIAS AND LOAD RESISTORS
Filed Feb. 10, 1961 4 Sheets-Sheet 3

CHARLES R. COOK, JR.
INVENTOR.
BY D. Carl Richards

CHARLES R. COOK, JR.
INVENTOR.

BY D. Carl Richards 3,119,028

ACTIVE ELEMENT CIRCUIT EMPLOYING SEMICONDUCTIVE SHEET AS SUBSTITUTE FOR THE BIAS AND LOAD RESISTORS

Charles R. Cook, Jr., Richardson, Tex., assignor to Texas Instruments Incorporated, Dallas, Tex., a corporation of Delaware Filed Feb. 10, 1961, Ser. No. 88,482
16 Claims. (Cl. 307—88.5)

This invention relates to electronic networks and more particularly to the control of electronic networks through the use of electric fields.

In electronic circuits and related systems it has been the practice to interconnect active elements such as vacuum tubes, transistors and the like with lumped impedances, condensers, resistances and inductances in order to effect the desired operation. In solid state semiconductor networks it has been proposed that the circuit elements such as resistors and condensers be "built into" the material on which the transistor itself is formed in order to minimize the difficulties encountered in making reliable connections between separate elements. Circuit connections are difficult to make and present problems as to reliability. They may be minimized by reducing the number of components and by utilizing multifunction components. In general, however, there is almost a 1:1 correspondence between the resistors in a circuit with standard components and physically shaped resistor regions of a semiconductor network. Resistor regions in solid state semiconductor networks, for example, ordinarily are physically formed as by etching, thus limiting current flow paths in a given body which paths have characteristics of individual resistors.

The present invention is one that eliminates identification of the discrete circuit components and allows circuit functions to be performed under the control of an electric field in the material on which the circuit itself is built. The electric field is established by interchange of electrical quantities between selected sources and selected points, areas, or volumetric zones on or within said material.

More particularly in accordance with the present invention, there is provided a method of controlling a multiterminal electronic device which device is responsive to electrical potentials. An electric current is established between a pair of spaced primary zones for forming an electric field. The electric field is characterized by equipotential surfaces whose orientation and distribution are dependent upon distribution of current flow between the zones. Interchange of electric quantities between terminals of the device and points having a predetermined areal spacing within the electric field serves simultaneously to modify the configuration of the electric field in dependence upon variations or conditions in the device and to modify potentials at the spaced points for control of the device. There may then be utilized interchange of electric quantities with at least one point on the device or within the field itself.

In a further aspect of the invention there is provided a system for control of a multiterminal electronic device. The system includes a solid conductive body of finite resistance to which there are connected a plurality of electric field sources including a primary current source connected to two points spaced apart in said body. Connections are provided between terminals of the electronic device and points on said body having an areal distribution for shaping resistance paths in said body by the electric field from said sources. Connections are then provided for deriving from said system an electrical quantity representative of variations in the electric field.

In accordance with a further aspect of the invention the system involves a solid state semiconductor network in or on which there are formed active elements and in which electric fields are varied to shape resistance paths therein for controlling the active element.

For a more complete understanding of the present invention and for further objects and advantages thereof, reference may now be had to the following description taken in conjunction with the accompanying drawings in which.

Figure 1:
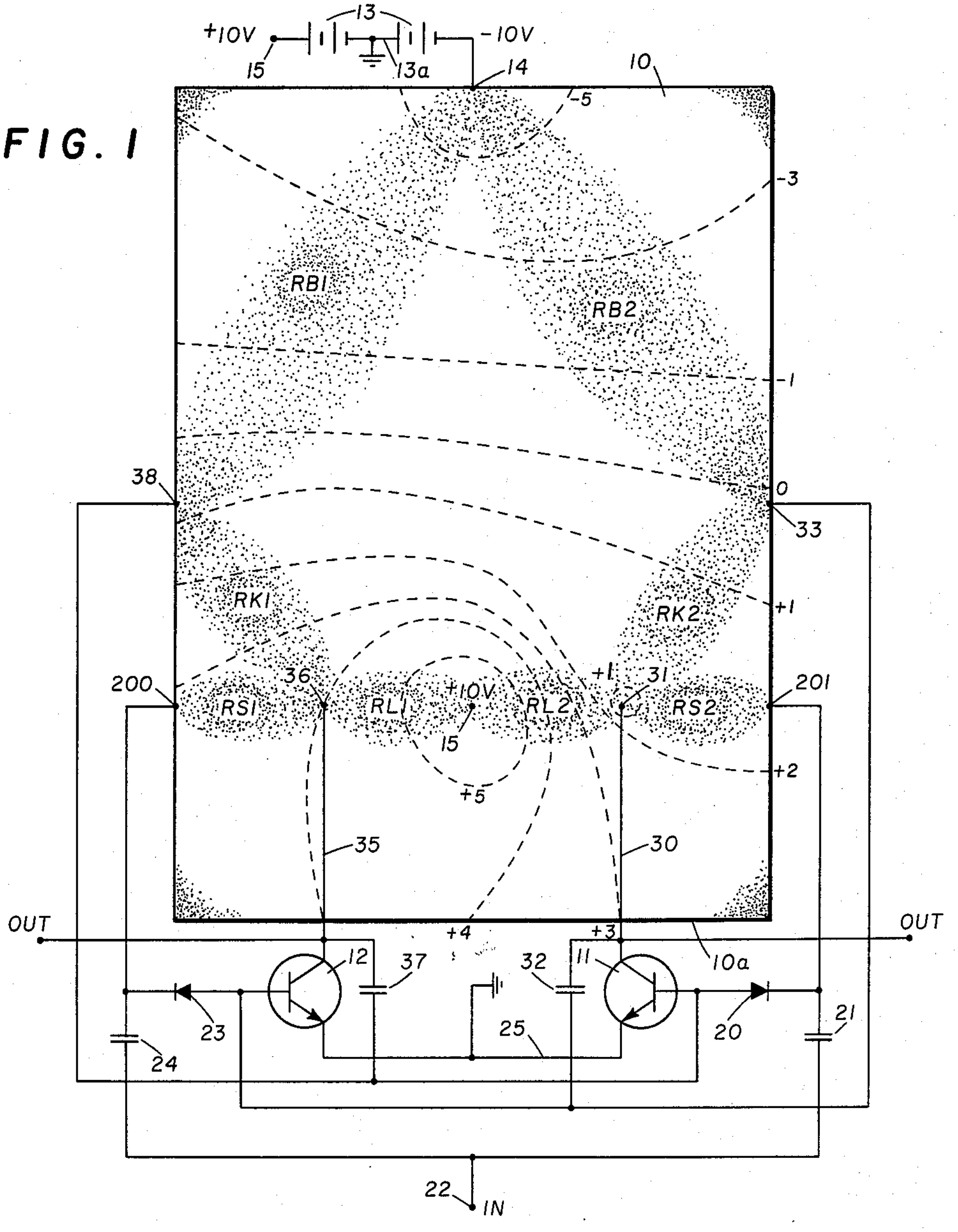
FIG. 1 illustrates the invention for controlling separated active elements with a conductive sheet.

Referring now to FIG. 1, there is illustrated one embodiment of the present invention in which the active elements in a logic circuit are controlled by an electric field. The term "active devices" as used herein may be taken to include devices such as vacuum tubes and solid state elements such as transistors and diodes. The active elements of the multivibrator of FIG. 1 are controlled by shaping resistive paths in a single sheet of conducting material 10. Shaping of electrical paths is accomplished through the interchange of electrical quantities between selected current sources, which sources may include a primary source such as a battery and secondary sources such as the various terminals on the active devices. The points at which interchange between the sources and the sheet 10 takes place have an areal distribution as distinguished from linear distribution. That is to say, the distribution is two-dimensional. As will be further shown in the description which follows, the distribution may be volumetric in character involving three-dimensional dispersion of interchange points.

In FIG. 1 a pair of NPN transistors 11 and 12 are employed as the active elements in the multivibrator. Power for operating the circuit is derived from a battery 13 which has the negative terminal thereof connected to point 14 at one edge of the conductive sheet 10. The positive terminal of battery 13 is connected to a point 15 located within the perimeter of the sheet 10. The center tap **13*a* of battery 13 is connected to ground. Points 14 and 15 are located along a central or median line extending through the sheet from top to bottom with the point 15 spaced from the bottom edge 10*a***.

The base of transistor 12 is connected by way of diode 23 and condenser 24 to the input terminal 22. The emitters of transistors 11 and 12 are interconnected by way of conductor 25 which is connected to ground. The collector electrode of transistor 11 is connected by way of conductor 30 to a point 31 on the sheet 10 and is connected by way of condenser 32 to the base of transistor 12 and to the point 33 at the right hand margin of the sheet 10. The collector of transistor 12 is connected by way of conductor 35 to point 36 on the sheet 10, by way of condenser 37 to the base of transistor 11, and to the point 38 at the left hand margin of the sheet 10.

Also shown in FIG. 1 are dotted lines extending across the sheet 10 and indicative of the −5, −3, −1, 0, +1, +2, +3, +4 and +5 equipotential lines of the electric field existing in the sheet 10 by reason of distributed current flow primarily between points 14, 15 and 31. The equipotential lines depict the electric field when the transistor 11 is conducting and transistor 12 is cut off.

If the battery 13 comprised the only source for current in sheet 10, then the equipotential lines would be distributed symmetrically with respect to points 14 and 15. However, the connections from the active elements 11 and 12 to selected points at the edges and to other points on sheet 10 comprise additional sources to modify the electric field pattern.

Proper positioning of the points over the two dimensions of sheet 10 controls the effective shape of the resistive paths within the sheet. Control of the active devices by shaping resistive paths in or on a solid conductive body by electric fields is provided by the present invention for system control and eliminates the need for physically shaping many discrete circuit elements employed in more conventional systems.

In the system illustrated in FIG. 1, the active elements 11 and 12 are separate units and are connected to sheet 10, connections extending therefrom to selected points such that the modification of the resistive paths by changing states of operation of the devices 11 and 12 will provide variations in control potentials for the devices themselves.

Figure 2:
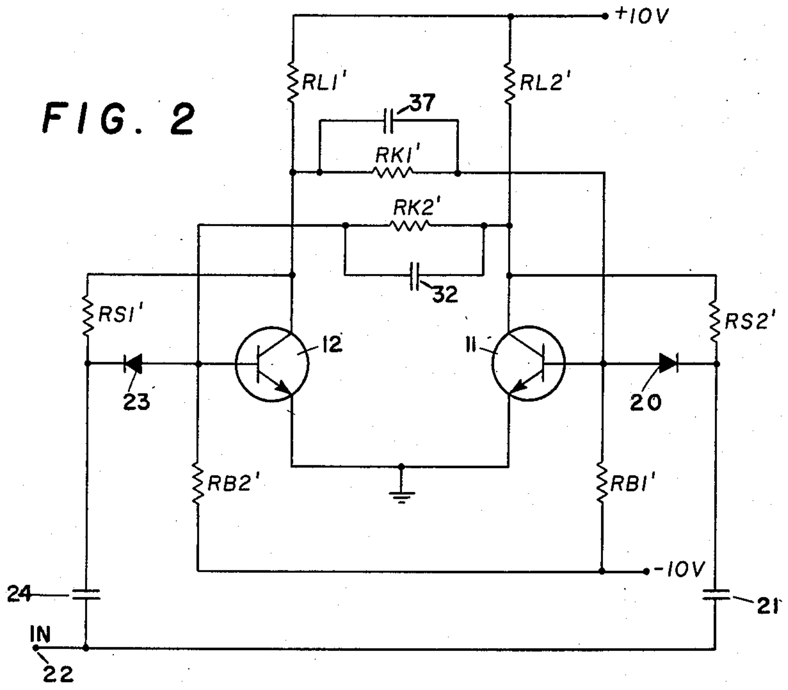
FIG. 2 is a multivibrator circuit corresponding with FIG. 1 but employing lumped impedances.

FIG. 2 illustrates a conventional bistable multivibrator employing lumped impedances. The circuit of FIG. 2 may be considered functionally to correspond with the multivibrator of FIG. 1 and is included to assist in gaining an understanding of the present invention. The lumped resistances of the circuit of FIG. 2 may be an approximation correspond with zones or areas in the conductive sheet 10 of FIG. 1. For example, the base bias resistor RB1′ of FIG. 2 may be considered to be the counterpart of the general area RB1 of FIG. 1, which is the area lying between point 14 and point 38. Similarly, the base bias resistor RB2′ of FIG. 2 can be said to correspond generally with the area RB2 between point 14 and point 33 on FIG. 1. The remaining elements RS1′, RS2′, RK1′, RK2′, RL1′, and RL2′ of FIG. 2 have been generally identified as areas on FIG. 1 by the same reference character as in FIG. 2, the prime symbol being omitted in FIG. 1.

Figure 3:
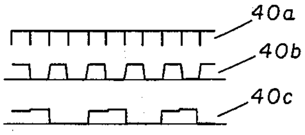
FIG. 3 illustrates waveforms from FIG. 1.

In one embodiment of the invention, the sheet 10 was a 6 inch x 8 inch sheet of resistive paper. The resistivity of the sheet 10 was about 2,000 ohms per square. Transistors 11 and 12 were of the type described by the 1960 Texas Instruments Incorporated of Dallas, Texas catalog, No. 2N697. Contact points 14, 15, 31, 33, 36 and 38 were located generally as scaled on the drawings. This system was found to be satisfactory in operation as a bistable multivibrator. Input pulses 40*a*, FIG. 3, were applied as triggering pulses to the input terminal 22. The output pulses 40*b* were derived from the collector of one of the transistors, for example, at the output terminal 36. The voltage thus produced in response to the input pulses 40*a* was a square wave output.

A difference which should be mentioned in connection with the operation of the system of FIG. 1 as compared with the system of FIG. 2 is that the switching in the system of FIG. 2 is approximately 100% whereas switching in the system of FIG. 1 is less complete but wholly adequate to provide reliable multivibrator action for control purposes.

In connection with the latter embodiment, a pair of circuits such as illustrated in FIG. 1 were constructed on a single conductive sheet in end-to-end relation with edges 10*a* corresponding with the boundary between the two systems. In that case, input pulses applied as at terminals 22 of the input of the first of the two multivibrators and represented by the waveform 40*a* resulted in an output voltage at the terminal corresponding with terminal 36 of the second multivibrator as represented by the waveform 40*c*. The slight step at the center of each positive-going pulse in waveform 40*c* indicates the existence of but slight crossfeed between the two multivibrators. The crossfeed level thus evaluated clearly indicates isolation between stages sufficient that a series of multivibrators as illustrated in FIG. 1 may be incorporated on a single sheet of conductive medium to provide a counter in which all of the resistive elements which otherwise would be required in a lumped circuit system are formed by a single conductive unit which may be of uniform conductivity. In each of the areas on the sheet occupied by a given multivibrator the current paths are shaped by the electric field effective therein. The resistive sheet in such case serves not only as a coupling element but as an isolating means. Its function may readily be controlled by selection as to geometry and sources.

While the foregoing deals primarily with a relatively simple circuit involving a switching operation in which current paths are shaped over different areas of thin conductive sheet, it will be understood and will hereinafter be shown that solid state semiconductor networks in which bulk solid elements form the current paths may be employed. Such bulk solids in the form of relatively thin sheets as represented by the sheet 10 of FIG. 1 or in such form as has an appreciable third dimension will be characterized by establishment therein of equipotential surfaces the locations of which are varied in response to changing states or conditions in associated active devices. In such cases the active devices may themselves be formed or built into the solid.

Thus the present invention dispenses with discrete physically formed circuit resistance elements and thus simplifies construction. Additionally the invention provides a basis for substtantial strides in the miniaturization of electronic circuitry. The following two examples will illustrate the latter point.

First: an embodiment of the invention was constructed with circuit arrangements generally the same as shown in FIG. 1 but reduced in size by a factor of 10, i.e., sheet 10 was 0.6 inch x 0.8 inch. A pair of high speed transistors were secured at the collectors to points corresponding with points 31 and 36 of FIG. 1 by conductive cement. Similarly, diodes corresponding with diodes 20 and 23 were secured to the conductive sheet. The remaining connections were made to points within the bounds and on the edges of the sheet in the manner illustrated in FIG. 1. The transistors employed in the latter embodiment were epitaxial mesa transistors of the type 2N743 described in the catalog of Texas Instruments Incorporated of Dallas, Texas. Such transistors are capable of extremely high speed switching action, having a cutoff point at about 500 megacycles. Diodes 20 and 23 were of type 1N914, described in the catalog of Texas Instruments Incorporated. Switching of the character illustrated in FIG. 3 to 3 megacycles was readily achieved This technique should lead to switching speeds which more closely approach the limits of the active elements themselves than heretofore possible.

Figure 4:
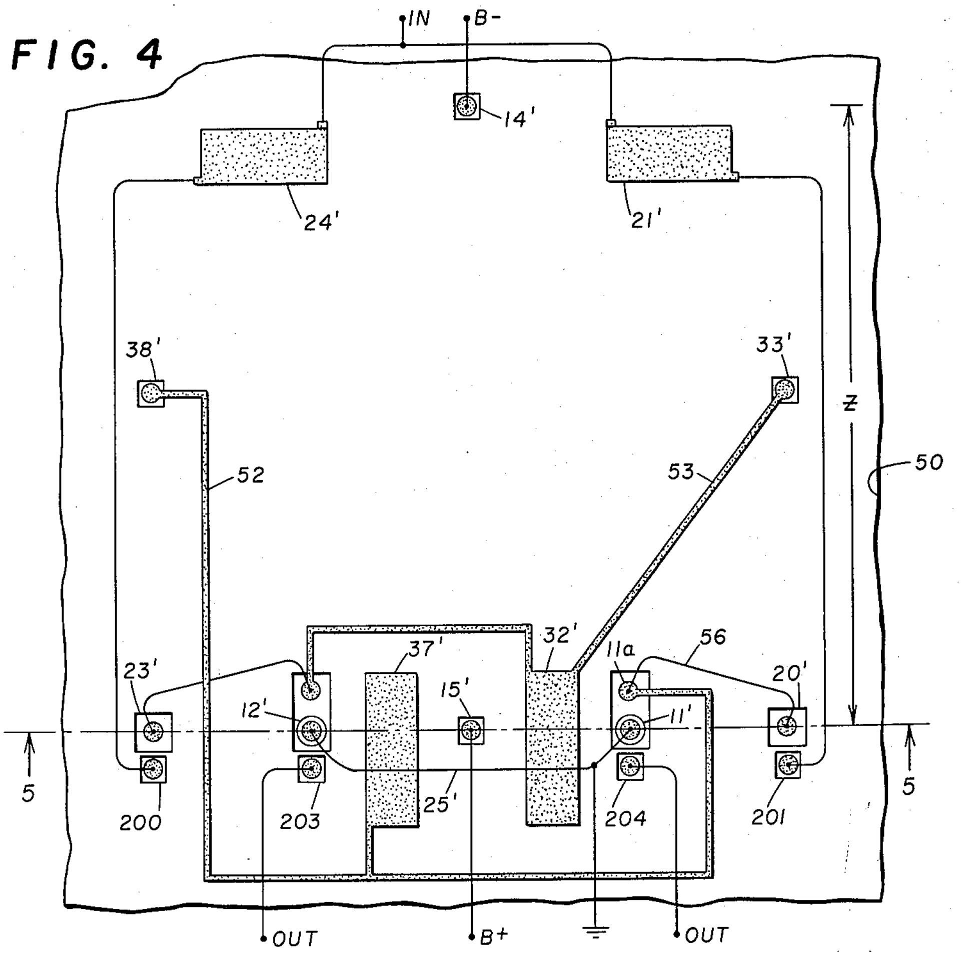
FIG. 4 is a view of a solid state unit corresponding with FIG. 1.
Figure 5:
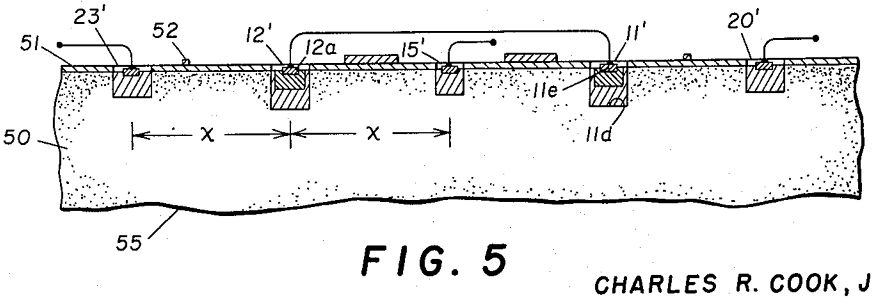
FIG. 5 is a sectional view of FIG. 4 taken along lines 5—5 of FIG. 4.

Second: an embodiment illustrated in FIGS. 4 and 5, shows the formation of the circuit of FIG. 1 integrally in a semiconductor mass, the active elements as well as the resistive elements in the system being formed on a unitary semiconductor body. The section 50 may comprise a silicon wafer of dimensions just sufficient to accommodate the circuit configuration placed thereon or it may form a section of a much larger body or slab of semiconductor material on which additional circuits are formed. FIG. 4 includes all of the elements of FIG. 1, the same being identified by the same reference characters as in FIG. 1 with addition of a prime symbol. The active devices, transistors 11′, 12′ and diodes 20′, 23′ are formed in the semiconductor slab 50 by techniques which result in a planar construction. More particularly as shown in FIG. 5, at contact sites and at base and emitter sites materials are diffused into the slab 50 to facilitate making connections and to form the active elements.

By way of illustration formation of the unit of FIG. 4 may involve the following steps.

(A) A slab of high resistivity N-type silicon is selected with resistivity preferably of the order of 5 to 10 ohm centimeters, and as nearly constant resistivity as possible over the surface.

(B) On to one surface of slab 50 there is applied a thermal oxide coating 51.

(C) After the coating 51 has been grown, it is removed from the selected base and anode areas for the diodes 20′, 23′ and the transistors 11′ and 12′.

(D) Boron is diffused into the exposed areas in an oxidizing atmosphere. The boron should extend to a depth of 0.1 mil with a surface concentration of $10^{17}$ boron atoms per cubic centimeter.

(E) The oxide is then removed at the selected emitter zones for devices 11′ and 12′ and contact zones 14′, 15′, 33′, 38′, 200, 201, etc.

(F) Phosphorus is diffused onto such zones to a depth of about 0.05 mil with surface concentration of the order of $10^{20}$ phosphorus atoms per cubic centimeter. By so diffusing the phosphorus into the body 50 at the contact points, there will be avoided the establishment of a junction and will thereby provide a site to which contacts may be made.

(G) Through a masking screen aluminum is evaporated and alloyed to form the contact zones.

(H) Through a masking screen aluminum is evaporated onto the surface to form the contact leads 52 and 53 as well as the conductive plate areas forming one plate of each of the condensers 32′ and 37′. In this connection the oxide layer insulates the aluminum thus evaporated at all points except on the contact sites as at point 33′ and base contact sites as at 11*a*.

(I) Following completion of the foregoing the back surface 55 of the slab 50 preferably will be lapped to a thickness of the order of about 3 mils to make the same of resistance as high as possible thereby reducing power consumption.

(J) Electrical connections are made between contact points, such as by way of conductor 56 extending between the base contact 11*a* of transistor 11′ and the diode 20′. Conductor 56 is a gold wire thermally bonded to the contact zone 11*a* on the base of transistor 11′ and to the contact zone on the diode 20′.

Input capacities 21′ and 24′ have been illustrated as coplanar with the surface of slab 50. They may comprise ceramic capacitors attached to the slab 50 or they may be otherwise provided by evaporation techniques to form a pair of plates for each capacitor located on the surface of slab 50 and separated by suitable dielectric.

Thus there may be formed in and on a semiconductor wafer the entire circuit illustrated in FIG. 2 to which a suitable voltage source may be connected. By way of illustration only, the dimensions Z on such a wafer may be of the order of 0.1–0.15″. The system may be scaled such that relative distances between elements and points remains unchanged. Further the size of a given element such as a transistor may be varied so long as it remains relatively small compared with distance between it and adjacent element or contact points. Otherwise if elements are employed having dimension comparable to the spacings involved due consideration will have to be given the effect thereof on the resultant field pattern.

It will be appreciated that in FIG. 5 the vertical dimensions are grossly exaggerated relative to horizontal dimensions. For example on a unit in which the dimension Z is of the order of 0.1″, the etched areas for contact sites would be of the order of 4 mils (0.004 inch) square. The zone 11*d*, FIG. 5, would be about .1 mil deep. The contact points facilitated through the diffusion of phosphorus such as represented by the block 11*e* would extend to a depth of about 0.05 mil. The drawings of FIGS. 4 and 5 should thus be taken as illustrative. The actual diffusion techniques and the technology relating to the building of active elements and connections thereto in solid-state circuitry are in general well-known.

Figure 6:
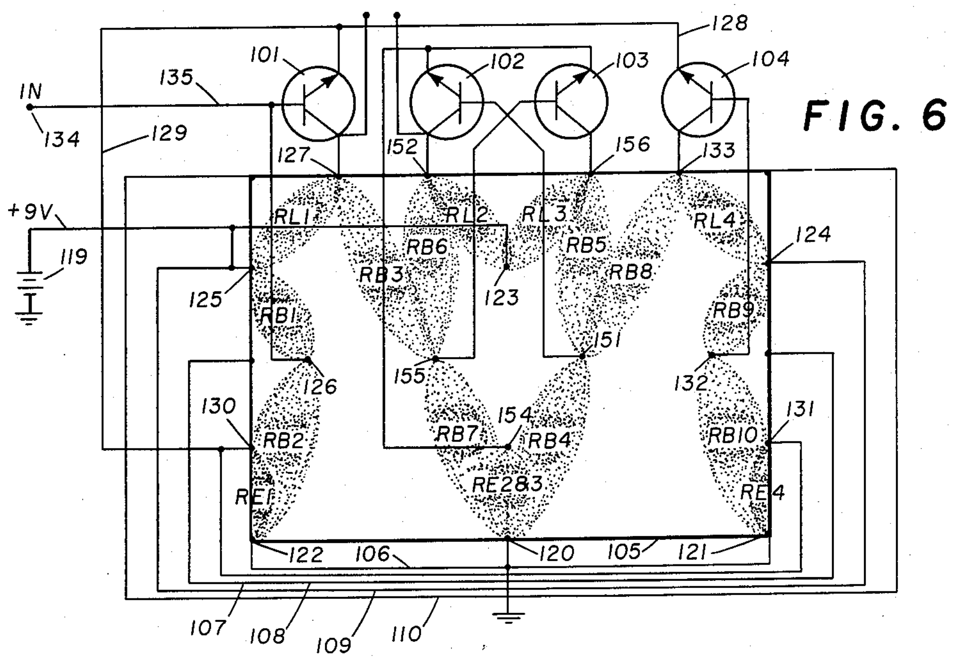
FIG. 6 illustrates a pair of differential amplifiers.

Referring now to FIG. 6, there is illustrated a differential amplifier system constructed in accordance with the present invention in which a first stage is comprised of units 101 and 104 and a second stage is comprised of units 102 and 103. Both stages are actuated in response to shaped electric fields in a conductive sheet 105. As in the system of FIG. 1 sheet 105 in one embodiment of the invention was a sheet of resistive paper 6 inch x 8 inch having a resistivity of about 2,000 ohms per square and the transistors 101–103 were the same type as employed in the system of FIG. 1.

For convenience the circuit was arranged to have cylindrical symmetry and for this reason the connections 106, 107, 108, 109 and 110 were provided between the spaced terminals at the edges of the sheet.

A battery was connected at its negative terminal to ground and, by way of conductor 106, to the contact points 120, 121 and 122 at the lower edge of sheet 105. The positive terminal of the battery was connected to points 123, 124 and 125. Transistor 101 was connected at its base to a point 126, at its collector to point 127, and at its emitter to conductor 128 and thenece to the emitter of transistor 104, and to points 130 and 131. Similarly transistor 104 was connected at its base to point 132 and at its collector to point 133.

The circuit thus far described comprised the first differential amplifier with provisions being made for application of an input signal to the input terminal 134 and, by way of conductor 135, to the base of transistor 101. The base of transistor 104 connected to point 132 on sheet 105 may be considered to be at a fixed potential except for field variations produced by operation of the system effecting the potential at point 132.

Figure 8:
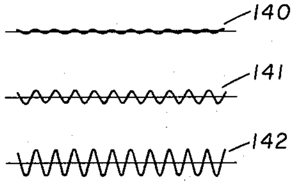
FIG. 8 illustrates waveforms in the system of FIG. 6.

Referring to FIG. 8, the input signal applied at terminal 134 is illustrated as waveform 140. The signal appearing at the collector of transistor 101 is illustrated by the waveform 141, showing a voltage gain of about two in the first stage.

In order properly to evaluate the effectiveness of such an amplifier system, the signal gain from base to collector is not so significant as the gain from the collector of the first stage relative to the signal at the collector of a succeeding stage.

In order to demonstrate overall gain readily obtainable in systems controlled as hereindescribed, the second differential amplifier comprising transistors 102 and 103 was provided. A signal represented by trace 142, FIG. 8, represents the signal at the collector of transistor 102.

Transistor 102 is connected at its base to point 151, at its collector to point 152; and at its emitter to the emitter of transistor 103 and to point 154. Similarly, transistor 103 is connected at its base to point 155 and at its collector to point 156. Actual spacings of points were substantially as scaled in FIG. 6. They were located to provide the symmetry which may readily be observed and then the magnitude of the voltage from battery 119 was adjusted for maximum gain as between the collectors of transistors 101 and 102. For the system including components as above described, the desirable battery voltage was found to be about 9 volts. The gain from collector to collector as shown from comparison of waveforms 141 and 142 was of the order of 2.

Figure 7:
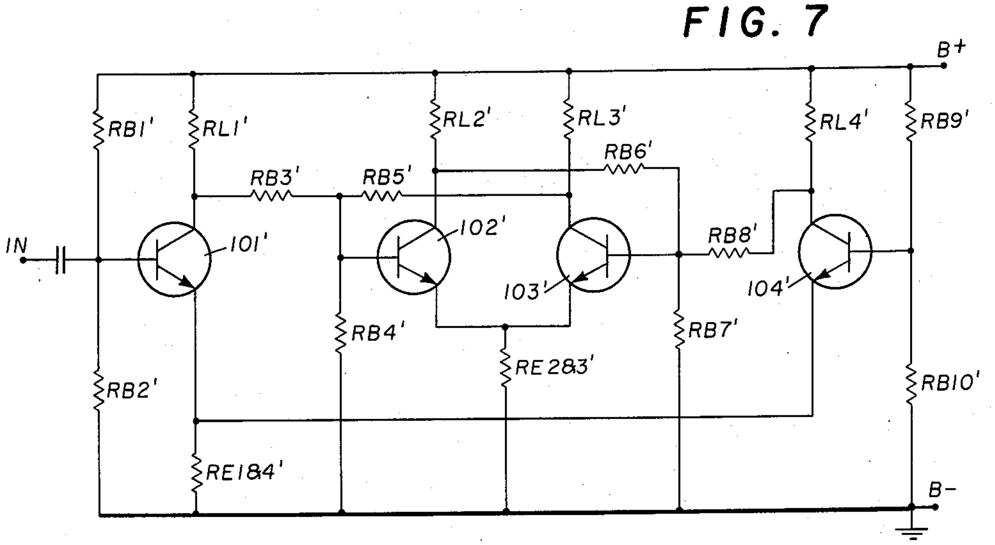
FIG. 7 illustrates a circuit corresponding with that of FIG. 6 but employing lumped impedances.

The system illustrated in FIG. 6 may have many different counterparts in circuits having lumped impedances. An approximate counterpart is illustrated in FIG. 7 wherein each of the lumped impedances has been given the same reference character as ascribed to corresponding functional areas on the sheet 105 except in the latter case the prime symbol has been omitted. The load resistor RL1′—RL4′ have been indicated in FIG. 7 as connected to the collectors of transistors 101′—104′. Biasing resistors and coupling resistors RB1′—RB10′ have been indicated as areas RB1—RB10 on sheet 105.

Similarly, the emitter resistors RE1—RE4' have been indicated as areas RE1—RE4 on sheet 105.

Figure 9:
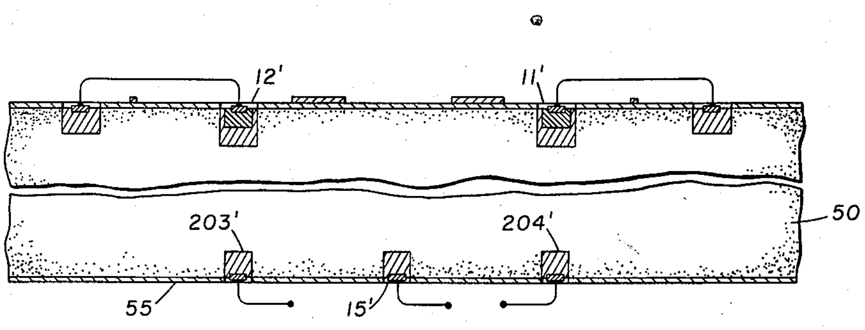
FIG. 9 illustrates a three-dimensional system constructed in accordance with the present invention.

Referring now to FIG. 9, there is illustrated a solid-state semiconductor network which corresponds with the sectional view of FIG. 5. However, in this instance the terminal 15' is formed on the side of the body 50 opposite the active elements 11' and 12'. Also, the output contacts 203 and 204 of FIG. 4 are positioned on the same face as contact 15'. The contacts 15'. 203' and 204' are thus positioned volumetrically with respect to equipotential surfaces established in the body 50 by interchange of electrical quantities between a suitable source and the active elements 11' and 12'. It will be understood that the remaining contact points 14', 33' and 38' may be formed on the surface 55 rather than on surface 51 shown in FIG. 5. In the latter case, selected volumes of the body 50 would comprise the resistive areas which most affect the operational relationship between a pair of points or elements connected to such points.

The electrical quantities interchanged between points in the electric field and the active elements may, as in the case of the differential amplifier of FIG. 6, be an input signal interchanged with the electronic unit at the input terminal. Also, an interchange of electrical quantities takes place at the output terminal, the input signal having been modified by operation of the differential amplifier. The input signals and/or output signals may for the purpose of the present description be understood to form utilization potentials. Thus, the invention is applicable to a transitory element for modifying a signal between input and output terminals or it may apply to a source such as an oscillator as in the case of a free-running multivibrator or even in the case of the amplifier of FIG. 6 when provided with feedback such that oscillation occurs. Further, the utilization potentials may be applied to a device constructed in accordance with the present invention which serves the function of a load unit.

In any case, it will be preferred that there be established an electric field in a solid conductive body represented in FIG. 1 by a sheet of resistance paper and in FIG. 4 by a slab of semiconductor material. The solid conductive body has a surface area which is substantial as compared with the size of contact terminals and active elements where the latter are formed on the conductive body. The term "area" as used in the latter sense is relative since it is understood that semiconductor devices as above described are properly termed microminiature circuit components wherein any surface of a solid conductive body would not be substantial except as compared with dimensions of other elements associated therewith. Thus, the invention relates to a method, a system, and an article of manufacture involving in a preferred embodiment a semiconductor body at least portions of which form a plurality of active elements spaced one from another. A plurality of input terminals are provided on the semiconductory body. The input terminals are spaced one from another and at least one of them is spaced from the sites of the active elements for establishing an electric field in the body upon connection of said points to a source of potential. Connections are provided from each of the elements to points having areal spacing on the body relative to sites of the active elements and locations of the input terminals for shaping resistance paths in or on the body by modification of the electric field by operation of the active elements. Connections are also provided on the body between a first point in the electric field, which is primarily controlled by a first of the active elements, and a second point in the electric field having a potential to which a second of the active elements is more responsive than the potential at the first of the points. By this means the second of the elements is controlled by the first of the elements upon interchange between the first and second points of signal potentials produced in response to operation of the first of the elements under control of the electric field.

While the invention has been described in connection with certain specific embodiments thereof, it is to be understood that further modifications may now suggest themselves to those skilled in the art and it is intended to cover such modifications as fall within the scope of the appended claims.

What is claimed is:

1. An electronic unit which comprises a solid conductive body of finite resistance having a surface of substantial area, an active electronic element adapted to control electric current in response to an input, a pair of spaced apart input terminals on said surface for connecting said body to a source of potential to establish an electric field in said body, connections from said element to points having areal spacings on said surface for shaping resistance paths in said body by modification of said electric field upon interchange of electric quantities between said element and said body by way of said connections, and circuit means extending to said body for interchange with said body of utilization potentials.

2. An electronic unit which comprises a solid conductive body of finite resistance having a surface of substantial area, an active electronic element adapted to control electric current in response to an input, a pair of input terminals on said surface spaced one from the other distances which are large compared to the dimensions of said terminals for connecting said body to a source of potential to establish an electric field in said body, connections from said element to points having areal spacings on said surface which are large compared to the dimensions of said connections for shaping resistance paths in said body by modification of said electric field upon interchange of electric quantities between said element and said body by way of said connections, and circuit means extending to said body for interchange with said body of utilization potenials.

3. An electronic unit which comprises a solid conductive body of finite resistance having a surface of substantial area, an active electronic element adapted to control electric current in response to an input forming a part of said body, a pair of spaced apart input terminals on said surface each of which is spaced from the site of said element distances which are large compared to the dimensions of said terminals for connecting said body to a source of potential to establish an electric field in said body, connections from said element to points having areal spacings on said surface which are large compared to the dimensions of said connections for shaping resistance paths in said body by modification of said electric field upon interchange of electric quantities between said element and said body by way of said connections, and circuit means extending to said body for interchange with said body of utilization potentials.

4. An eletronic unit which comprises a conductive sheet of finite resistance having a surface of substantial area, an active electronic element adapted to control electric current in response to an input, a pair of spaced apart input terminals on said surface for connecting said sheet to a source of potential to establish an electric field in said sheet, connections from said element to points having areal spacings on said surface which are large compared to the dimensions of said connections for shaping resistance paths in said sheet by modification of said electric field upon interchange of electric quantities between said element and said sheet by way of said connections, and circuit means extending to said sheet for interchange with said sheet of utilization potientials.

5. An electronic system which comprises a solid semiconductor body, an active electronic element adapted to control electric current in response to an input forming a part of said body, a pair of spaced apart input terminals on said body each of which is spaced from the site of said element for connecting said body to a source of potential to establish an electric field in said body, connections from said element to points having areal spacing in said body relative to said site and said input terminals for shaping resistance paths in said body by modification of said electric field by said element, and circuit means to said body for interchange with said body of signal potentials produced in response to operation of said element under control of said electric field.

6. An electronic system which comprises a semiconductor body, an active electronic element adapted to control electric current in response to an input forming a part of said body, a positive potential terminal and a negative potential terminal on said body respectively spaced from each other and from the site of said element for connecting said body to a source of potential to establish an electric field in said body, connections from said element to points having areal spacing in said body relative to said site and said positive potential terminal and said negative potential terminal for shaping resistance paths in said body by modification of said electric field by said element, and connections to said body for interchange with said body of signal potentials produced in response to operation of said element under control of said electric field.

7. An electronic circuit which comprises a solid semiconductor body, a direct-current source, an active electronic element adapted to control electric current in response to an input forming a part of said body, a pair of spaced apart input terminals on said body each of which is spaced from the site of said element for connecting said body to said D.C. source to produce a D.C. field in said body, connections from said element to points having areal spacing in said body relative to said site and said input terminals for shaping resistance paths in said body by modification of said D.C. field by said element, and connections to said body for interchange with said body of signal potentials produced in response to operation of said element under control of said D.C. field.

8. An electronic circuit which comprises an active multiterminal electronic device adapted to control electric current in response to an input, a source of unidirectional voltage, a conductive solid body of finite resistance, connections for applying the potential from said source to two points on said body for distributed current flow therethrough, circuit means for interconnecting the terminals of said active device to points on said body spaced from each other and from said two points for developing control potentials for said active device in response to the distributed voltage pattern in said body, an input circuit for applying a signal to said active device, and an output circuit for deriving a signal therefrom modified by operation of said active device.

9. An electronic circuit component which comprises an active multiterminal electronic device adapted to control electric current in response to an input, a conductive solid of finite resistance, connections extending from at least two points on said solid for connecting said points to a source of potential for establishing distributed current flow therethrough, circuit means for interconnecting the terminals of said active device to spaced points on said conductive solid for developing control potentials for said active device in response to the distributed voltages in said conductive solid upon current flow therethrough, an input circuit for applying a signal to said active device, and an output circuit for deriving therefrom said signal modified by operation of said active device.

10. An electric circuit which comprises an active multiterminal electronic device adapted to control electric current in response to an input, a source of unidirectional voltage, a conductive solid of finite resistance, connections extending from at least two points on said solid for connecting said points to a source of potential distributed current flow therethrough, circuit means for interconnecting the terminals of said active device to spaced points on said conductive solid for developing control potentials for said active device in response to the distributed voltages in said conductive solid upon current flow therethrough, and an output circuit for deriving therefrom a signal produced by operation of said active device.

11. A system for control of a multiterminal electronic device adapted to control electric current in response to an input which comprises a solid conductive body of finite resistance, connections for applying primary current to spaced points in said body, connections extending between terminals of said device and spaced points on said body for shaping resistance paths in said body by the electric field produced upon flow of said current thereby to control said device, and connections for deriving from said system an electrical quantity representative of variations of said electric field.

12. An article of manufacture which comprises a semiconductor body, an active electronic element adapted to control electric current in response to an input forming a part of said body, a pair of spaced apart input terminals on said body each of which is spaced from the site of said element for connecting said body to a source of potential to produce an electric field in said body, connections from said element to points having areal spacing on said body relative to said site and to said input terminals for shaping resistance paths in said body by modification of said electric field by said element, and connections to said body for interchange with said body of signal potentials representative of operation of said element under control of said electric field.

13. An article of manufacture which comprises a semiconductor body, a transistor forming a part of said body, a pair of spaced apart input terminals on said body each of which is spaced from the site of said transistor for connecting said body to a source of potential to produce an electric field in said body, connections from said transistor to points having areal spacing on said body relative to said site and said input terminals for shaping resistance paths in said body by modification of said electric field by said transistor, and connections to said body for interchange with said body of signal potentials produced in response to operation of said transistor under control of said electric field.

14. An article of manufacture which comprises a semiconductor body having a control face, an active electronic element adapted to control electric current in response to an input on said control face forming a part of said body, a pair of spaced apart input terminals on said control face spaced from the site of said element for connecting said body to a source of potential to produce an electric field in said body, connections from said element to points having areal spacing on said control face relative to said site and said input terminals for shaping resistance paths in said body by modification of said electric field by said element, and connections to said body for interchange with said body of signal potentials produced in response to operation of said element under control of said electric field.

15. An electronic system which comprises a semiconductor body, a plurality of active electronic elements each adapted to control electric current in response to an input spaced one from another forming a part of said body, a plurality of input terminals on said body, said input terminals being spaced one from another and at least one being spaced from the sites of said elements for connecting said body to a source of potential to produce an electric field in said body, connections from each of said elements to points having areal spacing on said body relative to said sites and said input terminals for shaping resistance paths in said body by modification of said electric field by said elements, and connections on said body for interchange between points on said body of signal potentials produced in response to operation of said elements under control of said electric field.

16. An electronic system which comprises a semiconductor body, a plurality of active electronic elements each adapted to control electric current in response to an input spaced one from another and forming a part of said body, a plurality of input terminals on said body, said input terminals being spaced one from another and at least one being spaced from the sites of said elements for connecting said body to a source of potential to produce an electric field in said body, connections from each of said elements to points having areal spacing on said body relative to said sites and said input terminals for shaping resistance paths in said body by modification of said electric field by said elements, and connections on said body between a first point in said field primarily controlled by a first of said elements to a second point in said field having a potential to which a second of said elements is more responsive than the potential at said first point for control of said second of said elements by said first of said elements by interchange between said points of signal potentials produced in response to operation of said first of said elements under control of said electric field.

References Cited in the file of this patent

UNITED STATES PATENTS

| | | |
|---|---|---|
| 2,816,228 | Johnson | Dec. 10, 1957 |
| 2,985,804 | Buie | May 23, 1961 |
| 3,022,472 | Tanenbaum et al. | Feb. 20, 1962 |
| 3,029,366 | Lehovec | Apr. 10, 1962 |

FOREIGN PATENTS

| | | |
|---|---|---|
| 566,048 | Italy | Aug. 20, 1957 |
| 854,908 | Great Britain | Nov. 23, 1960 |